United States Patent [19]  
Ishii et al.

[11] Patent Number: 4,757,276  
[45] Date of Patent: Jul. 12, 1988

[54] SIGNAL-PROCESSING CIRCUIT HAVING A FIELD-EFFECT MOSFET AND BIPOLAR TRANSISTORS

[75] Inventors: Tetsuo Ishii, Fujisawa; Takashi Kimura; Taira Matsunaga, both of Yokohama; Mie Nomura, Fujisawa; Shoichi Tanimata, Yokohama, all of Japan

[73] Assignee: Kabushiki Kaisha Toshiba, Kawaski, Japan

[21] Appl. No.: 899,592

[22] Filed: Aug. 25, 1986

[30] Foreign Application Priority Data

Aug. 28, 1985 [JP] Japan ................................. 60-189232  
Mar. 31, 1986 [JP] Japan ................................. 61-72950

[51] Int. Cl.⁴ ............................................. H03G 3/30  
[52] U.S. Cl. .................................... 330/278; 330/277; 330/300; 330/307; 330/311  
[58] Field of Search ............... 330/277, 285, 278, 300, 330/307, 311; 332/31 T; 307/529; 455/118, 333; 357/43

[56] References Cited  
U.S. PATENT DOCUMENTS 3,541,234 11/1970 Austin ............................. 330/300 X  
3,609,479 9/1971 Lin et al. ................................ 357/43  
4,586,004 4/1986 Valdez ................................. 330/300

FOREIGN PATENT DOCUMENTS 1512683 8/1969 Fed. Rep. of Germany ....... 330/300

OTHER PUBLICATIONS

Chizhikov et al., "Broadband Amplifier for Measuring Propagation of Ultrasonic Vibrations in Sulios," Instruments & Experimental Techniques, vol. 19, No. 5, Mar. 1977, pp. 1406-1407.  
Roberts et al., "M.O.S.-Bipolar Amplifiers," Wireless World, Jul. 1969, pp. 328-330.  
Nienhuis, "Integrated Audio Amplifiers with High Input Impedance and Low Noise," Phillips Technical Review, 1970, pp. 245-247.  
Vora, "Fet-Bipolar Integration," IBM Technical Disclosure Bulletin, vol. 13, No. 5, Oct. 1970 p. 1106.  
Research Disclosure, May 1979, No. 181, p. 211.  
Translation of the Claims and Description of the Drawings of Japanese Patent Disclosure (KOKAI) No. 57-160170.  
Translation of pages 96-98 of MOS IC & FET" in the Electronic Science Series, 27.

Primary Examiner—James B. Mullins  
Attorney, Agent, or Firm—Finnegan, Henderson, Farabow, Garrett and Dunner

[57] ABSTRACT

The signal-processing circuit of the present invention, more particularly the gain-controlled amplifier circuit, comprises a MOSFET (metal oxide semiconductor field-effect transistor), and an NPN bipolar transistor cascade-connected to the MOSFET. The gain-controlled amplifier circuit amplifiers the signal supplied to the gate of the MOSFET, with the gain corresponding to the voltage applied to the base of the NPN bipolar transistor. The circuit can generate an output signal at one end of the emitter-collector path of the NPN bipolar transistor, said output signal containing negligibly small distortion components; in particular, negligible third distortion components.

21 Claims, 8 Drawing Sheets

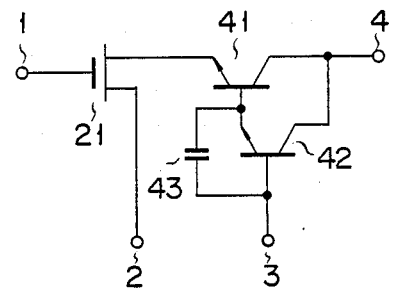
F I G. 9
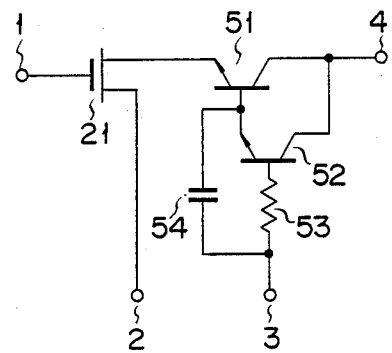
F I G. 10
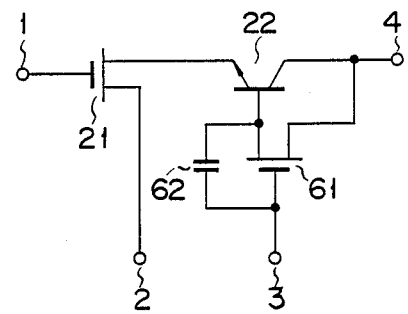
F I G. 11

SIGNAL-PROCESSING CIRCUIT HAVING A FIELD-EFFECT MOSFET AND BIPOLAR TRANSISTORS

BACKGROUND OF THE INVENTION

The present invention relates to a signal-processing circuit having a field-effect transistor and a bipolar transistor connected in cascade to the field-effect transistor.

A gain-controlled amplifier for use in a high-frequency amplifying stage, such as a tuner, has the structure shown in FIG. 1 or that shown in FIG. 4.

The amplifier of FIG. 1 is disclosed in Japanese Patent Disclosure Sho No. 61-160170. This circuit comprises a MOSFET 11 (metal oxide semiconductor field-effect transistor) used as the first stage, and another MOSFET 12 used as the second stage and cascade-connected to MOSFET 11. The gate of FET 11 is connected to input terminal 1 which in turn is coupled to an input tuning circuit (not shown), and can receive a DC bias signal and an input signal from the tuning circuit via input terminal 1. A predetermined voltage (usually, the ground potential) is applied to the gate of FET 12 through gain control terminal 3. The drain of FET 12 is connected to output terminal 4.

The amplifier shown in FIG. 4 is disclosed in *Integrated Electronics*, McGraw-Hill, Inc., pp 566-569. This circuit comprises an NPN transistor 13 used as the first stage, and an NPN transistor 14 used as the second state and which is cascade-connected to NPN transistor 13. The base of transistor 13 is coupled to input terminal 1. The emitter of transistor 13 is connected to terminal 2 held at a predetermined potential. The base and collector of transistor 14 are connected to gain control terminal 3 and output terminal 4, respectively.

The amplifier of FIG. 1 amplifies the signal supplied to input terminal 1 when a predetermined operation current flows through first-stage FET 11 and second-stage FET 12. The amplifier has one drawback, however. Its input-output characteristic contains prominent third distortion components. This is because the MOSFETs have a high equivalent resistance, due to their structure and function. More specifically, the amplifier exhibits the DC input-output characteristics shown in FIG. 2, when a gain control voltage is applied to the gate of FET 12. The DC input-output characteristic is the relation between voltage V12 between terminals 1 and 2, and current I42 flowing between terminals 2 and 4. In FIG. 2, voltage V32 between terminals 2 and 3 (i.e., the gain-controlling voltage) is regarded as a parameter, and voltage V42 between terminals 2 and 4 is fixed at 6 V. The equivalent resistance of FETs 11 and 12 affects the prominence of the third distortion components of output current I42 near the boundary between the region where the characteristic of FET 11 is predominant and current I42 is thus small, and the region where the characteristic of FET 12 is predominant and current I42 is large. By differentiating the input-output characteristic curve shown in FIG. 2, we can obtain the forward transmission admittance $|Yf|$ ($=\Delta I42/\Delta V12$) with respect to input voltage V12, which is shown in FIG. 3. The inflection points shown in FIG. 3 correspond to the third distortion components of the input-output characteristic curve (FIG. 2). As FIG. 3 clearly shows, there are inflection points where the slope of the characteristic curve is steep. This means that the characteristic curve has prominent third distortion components. FIG. 3 further reveals that there are two inflection points where gain-controlling voltage V32 falls. If such is the case, the third distortion components will become more prominent.

In the amplifier shown in FIG. 4, the equivalent resistance of the collector-emitter path of transistor 13 is far lower than that of either MOSFET used in the amplifier of FIG. 1. However, the input-output characteristic curve of the amplifier shown in FIG. 4 also has prominent third distortion components. This is inevitably because the first-stage transistor is a bipolar transistor.

SUMMARY OF THE INVENTION

The object of this invention is to provide a signal-processing circuit whose input-output characteristic curve has small distortion components; in particular, small third distortion components.

To achieve the above object, a signal-processing circuit according to the present invention comprises means for receiving a first signal; a metal oxide semiconductor field-effect (MOSFET) whose gate is connected to the means for receiving the first signal and whose current path is supplied with a predetermined potential; means for receiving a second signal; means for supplying an output signal; and an NPN bipolar transistor whose collector-emitter path is connected at one end to the current path of the MOSFET and at the other end to the means for supplying the output signal, whose base is connected to the means for receiving the second signal, and whose base current is controlled by the second signal supplied from the means for receiving the second signal. The first signal can therefore be controlled by the second signal. The signal-processing circuit can have an input-output characteristic curve with negligible distortion components, particularly negligible third distortion components.

BRIEF DESCRIPTION OF THE DRAWINGS

FIG. 8 through FIG. 10 are circuit diagrams showing some modifications of the amplifier illustrated in FIG. 5;

FIG. 11 is a circuit diagram of another gain-controlled amplifier according to the invention;

DETAILED DESCRIPTION OF THE PREFERRED EMBODIMENTS

A first embodiment of the invention will now be described with reference to the accompanying drawings.

Figure 5:
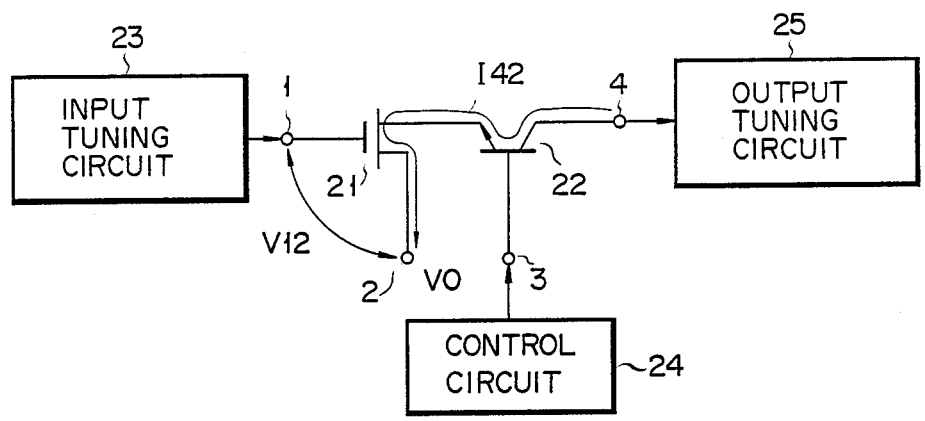
FIG. 5 is a circuit diagram showing a gain-controlled amplifier according to the invention.

FIG. 5 is a circuit diagram of a gain-controlled amplifier according to one embodiment of the invention. As shown in FIG. 5, the source of N-channel enhancement or depletion enhancement MOSFET 21 is connected to terminal 2 to which a predetermined potential (usually, the ground potential) is applied. The gate of FET 21 is coupled to input terminal 1 which in turn is connected to input tuning circuit 23. The emitter of NPN bipolar transistor 22 is connected to the drain of FET 21. The base of NPN transistor 22 is coupled to gain control terminal 3 which in turn is connected to gain control circuit 24. The collector of NPN transistor 22 is connected to output terminal 4 coupled to output tuning circuit 25.

The amplifier of FIG. 5 operates in the following way: Input tuning circuit 23 receives a high-frequency signal obtained from, for example, VHF-band TV waves. Circuit 23 supplies this high-frequency signal and, if necessary, a DC bias signal to input terminal 1. As a result, a predetermined operation current flows from the power source of output tuning circuit 25 to terminal 2 through terminal 4, the collector-emitter path of NPN transistor 22 and the current path of FET 21. As this current flows through both transistors 21 and 22, the input signal, i.e., the high-frequency signal, is amplified with the gain corresponding to the gain-controlling voltage applied to the base of transistor 22.

Figure 6:
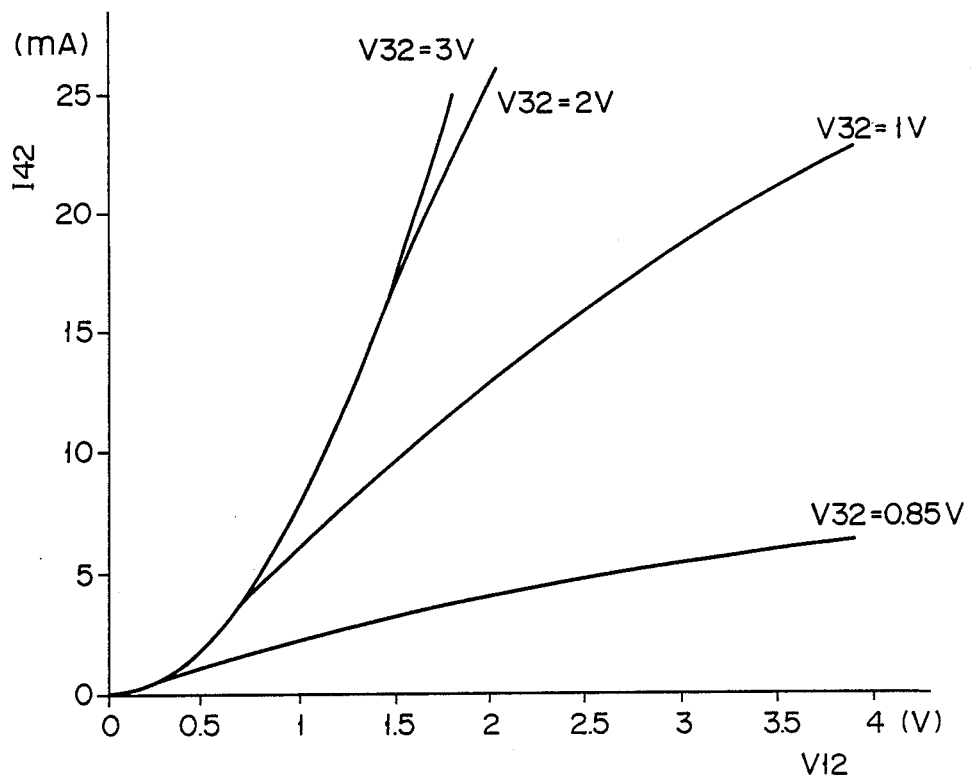
FIGS. 6 and 7 are diagrams showing the characteristics of the amplifier shown in FIG. 5.

Input voltage V12 (i.e., the voltage between terminals 1 and 2) and output current I42 (i.e., the current between terminals 4 and 2) have the relationship illustrated in FIG. 6. In the graph of FIG. 6, operation voltage V42 (i.e., the voltage between terminals 4 and 2) is set at 6 V, and control voltage V32 (i.e., the voltage between terminals 3 and 2) is used as a parameter. Voltage V12 and current I42 have this relationship when FET 21 has a good high-frequency characteristic, and when NPN transistor 22 can maintain optimum frequency characteristic with respect to current amplification factor hFE so long as the frequency of the input signal is about 1 GHz (fT=1 GHz) or less, and that amplification factor hFE remains maximum so long as the collector current of transistor 22 is about 80 mA or less.

Figure 1:
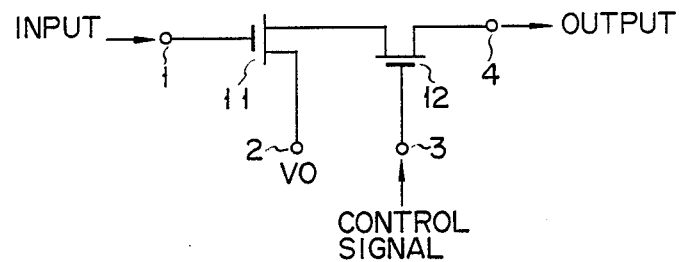
FIGS. 1 and 4 are circuit diagrams showing conventional gain-controlled amplifiers.
Figure 2:
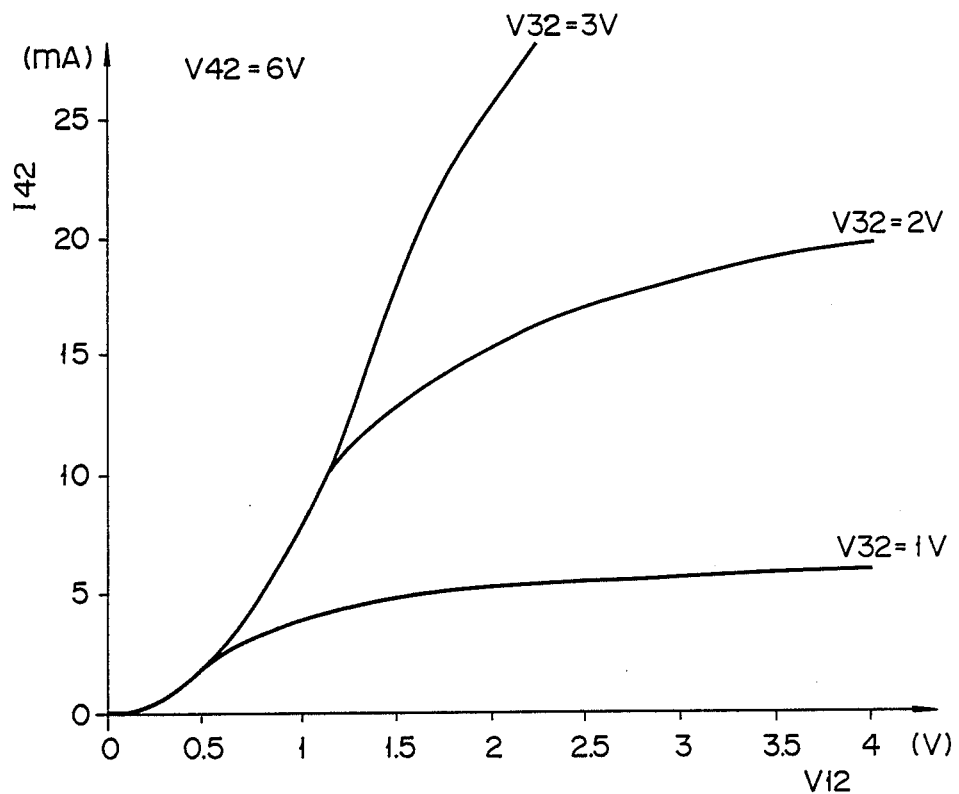
FIGS. 2 and 3 are diagrams showing the characteristics of the amplifier shown in FIG. 1.
Figure 3:
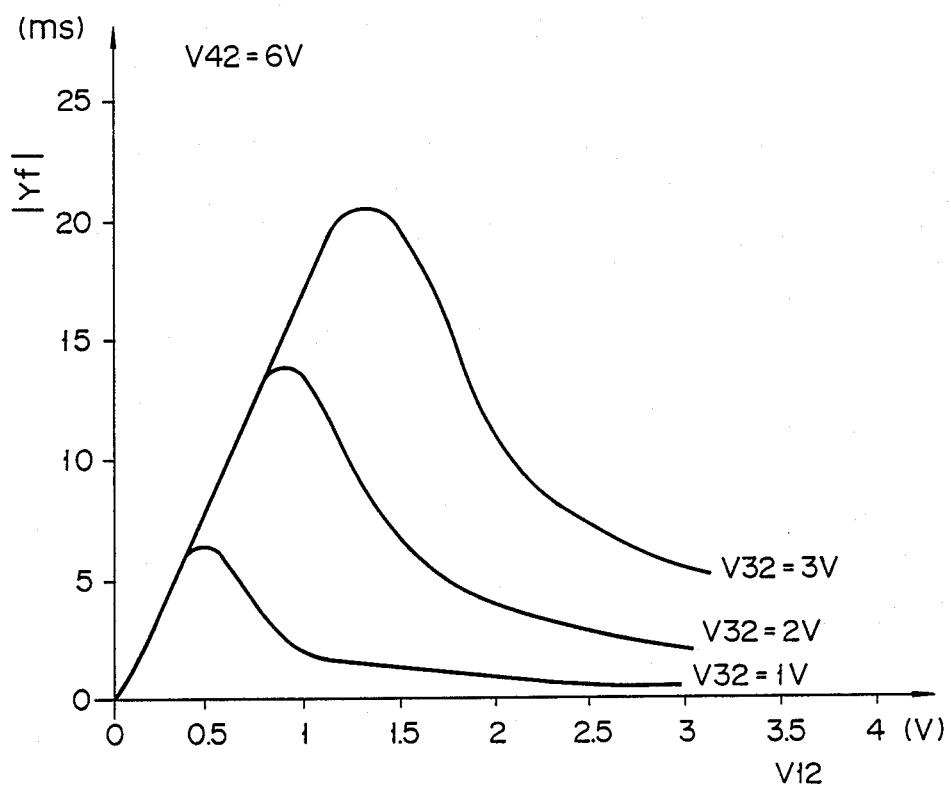
Figure 4:
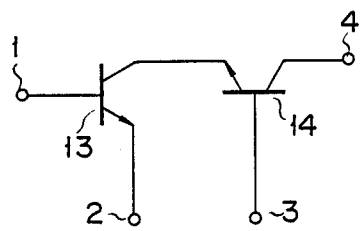
Figure 7:
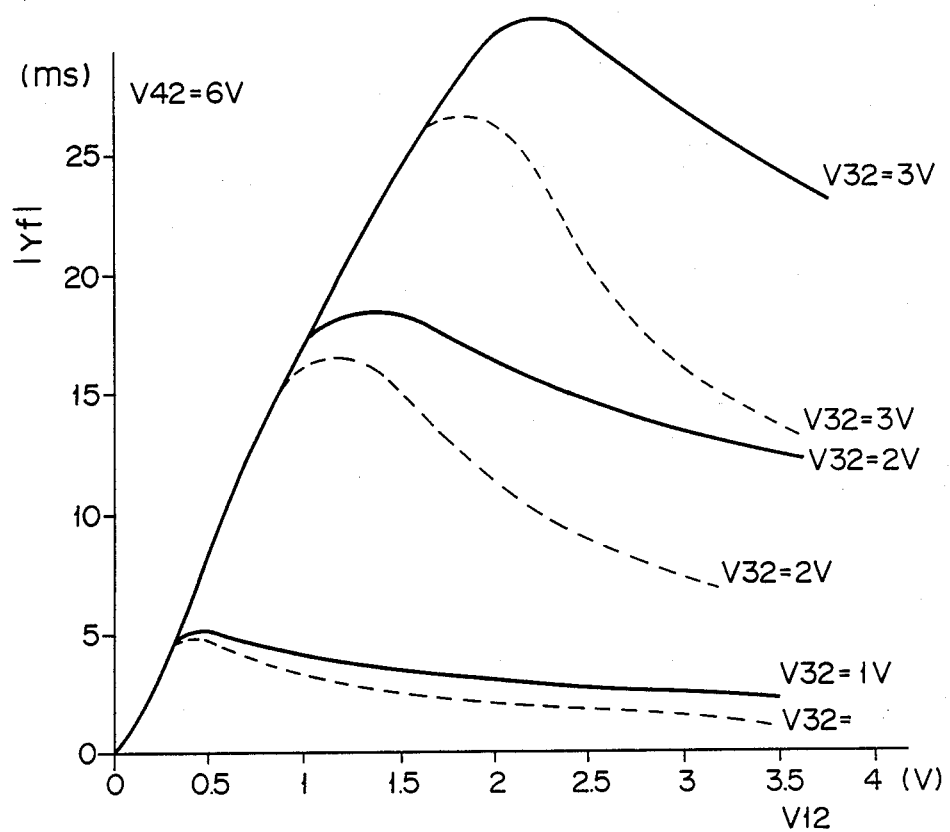

Forward transmission admittance $|Yf|$ (=$\Delta I12/\Delta V12$) obtained by differentiating the input-output characteristic curve shown in FIG. 6, is shown by solid lines in FIG. 7. As evident from FIG. 7, change rate of admitance $|Yf|$ is small near inflection points. There is only one inflection point in the region even if control voltage V12 is low. This means that the third distortion components of the input-output characteristic curve of the amplifier shown in FIG. 5 are less prominent than those of the input-output characteristic curve of the conventional gain-controlled amplifier (FIG. 1). Further, as can be clearly understood from FIG. 6, the characteristic curve is more linear than that of the conventional amplifier (FIG. 1). Hence, the first distortion components and second distortion components of the characteristic curve are also less prominent than those of the characteristic curve of the conventional amplifier (FIG. 1). The gain changes in accordance with control voltage V12, same as the conventional gain-controlled amplifiers shown in FIGS. 1 and 4. The gain-controlled amplifier of this embodiment can therefore generate an output signal containing distortion components which are less prominent than those of the output signal produced by the conventional gain-controlled amplifiers.

In the case where the high-frequency has been obtained from UHF-band TV waves, it is desirable that second-stage transistor 22 have an even better high-frequency characteristic, (for example, fT=3 GHz).

Several modifications of the gain-controlled amplifier shown in FIG. 5 will now be explained with reference to FIGS. 8 to 10. All these modifications have the same basic structure as the amplifier of FIG. 5. Hence, the same elements of each modification as those of the amplifier (FIG. 5) will be designated by the same numerals and will not be described in detail. Only those features of each modification which are different from those of the amplifier (FIG. 5) will be described in detail.

Figure 8:
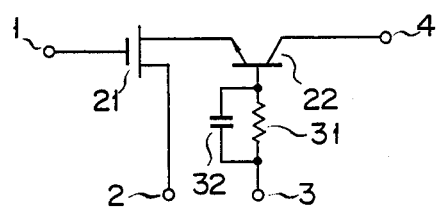

The modification of FIG. 8 is characterized in two respects. First, resistor 31 for adjusting the base current of second-stage transistor 22 and protecting the base of transistor 22, is connected between the base of transistor 22 and gain control terminal 3. Secondly, capacitor 32 for grounding high-frequency components of a signal, is connected between the base of transistor 22 and gain control terminal 3. Forward transmission admittance $|Yf|$ of this modification is shown by broken lines in FIG. 7. As can be understood from FIG. 7, the input-output characteristic curve of the modification has third distortion components which are less prominent than those of the characteristic curve of the conventional gain-controlled amplifier (FIG. 1).

The modification shown in FIG. 9 is also characterized in two respects. First, Darlington-connected NPN transistors 41 and 42 are used in place of second-stage transistor 22. Secondly, capacitor 43 for grounding the high-frequency components of a signal, is connected between the base of transistor 41 and gain control terminal 3. Capacitor 43 can be coupled between the source of FET 21 and the base of transistor 41.

The modification shown in FIG. 10 has three characterizing features. First, Darlington-connected NPN transistors 51 and 52 are used in place of second-stage transistor 22. Secondly, resistor 53 for adjusting the base current of transistor 52, is coupled between the base of transistor 52 and gain control terminal 3. Thirdly, capacitor 54 for grounding the high-frequency components of a signal, is connected between the base of transistor 51 and gain control terminal 3.

Another gain-controlled amplifier according to the second embodiment of this invention will now be described with reference to FIG. 11. This gain-controlled amplifier is different from the amplifier of FIG. 5 in the following two respects:

(1) The drain of N-channel enhancement MOSFET 61 is connected to the collector of second-stage transistor 22, source of MOSFET 61 is coupled to the base of transistor 22, and the gate of MOSFET 61 is connected to gain control terminal 3.

(2) Capacitor 62 for grounding the high-frequency components of a signal, is connected between the base of second-stage transistor 22 and gain control terminal 3.

The capacitance between the drain and source of FET 61 should ideally be small. Otherwise, an excessive capacitance will be added between the collector and emitter of transistor 22. For this reason, FET 61 should have similar high-frequency characteristic and are highly sensitive (that is, having a high mutual conductance), same as FET 21.

Figure 12:
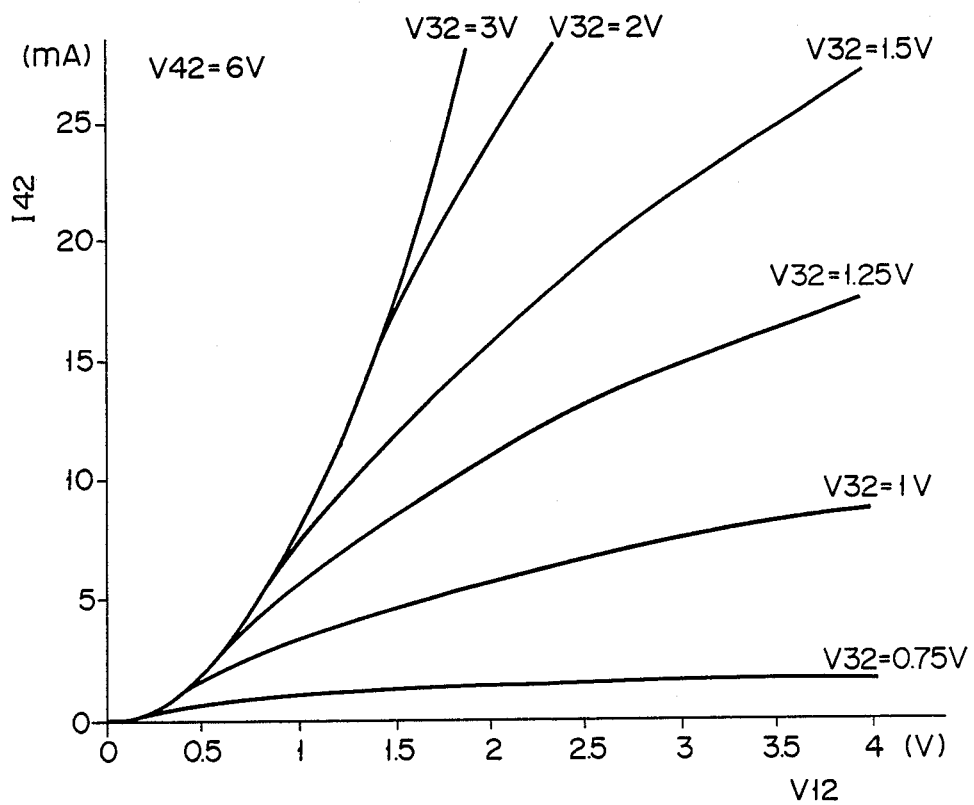
FIGS. 12 and 13 are diagrams showing the characteristics of the amplifier shown in FIG. 11.
Figure 13:
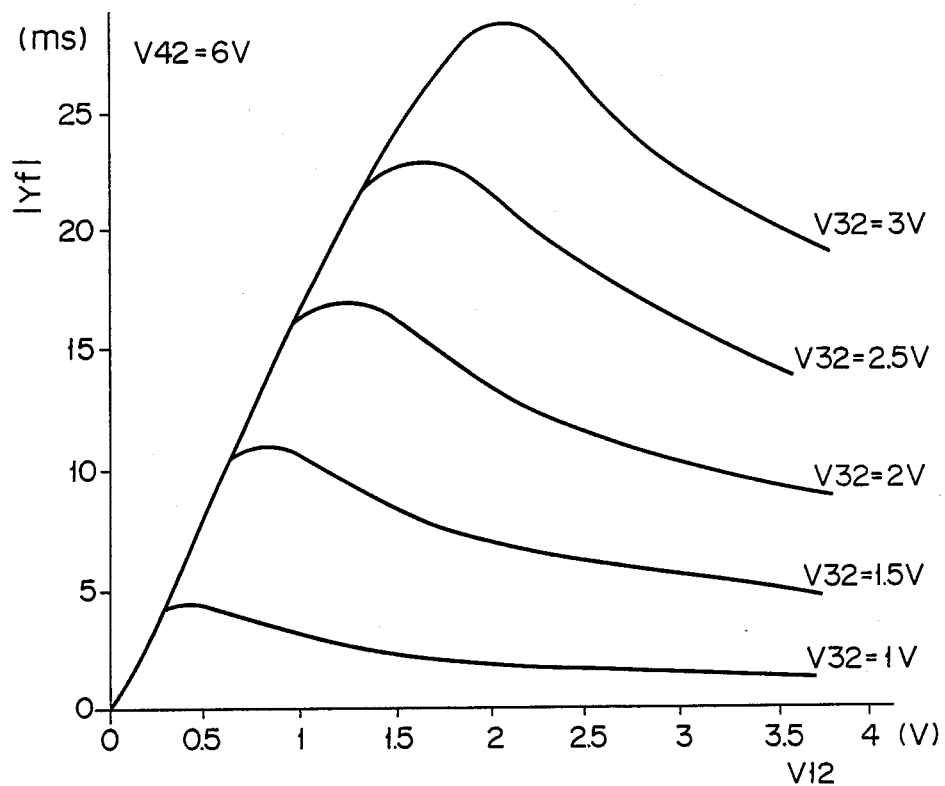

In the gain-controlled amplifier of FIG. 11, the gate voltage of FET 61 is controlled, thereby controlling the drain current of FET 61. As a result, the base current of transistor 22 is controlled. The amplifier has the input-output characteristic shown in FIG. 12. Its forward transmission admittance |Yf| is illustrated in FIG. 13. As is evident from FIGS. 12 and 13, the amplifier can be gain-controlled and can generate an output signal containing less distortion components than the output signal of the amplifier shown in FIG. 5.

Figure 14:
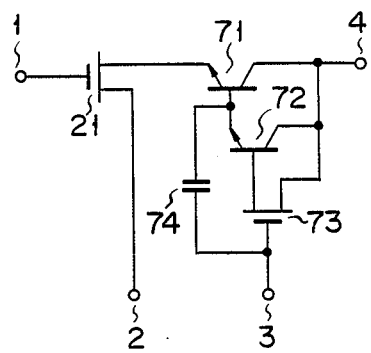
FIG. 14 is a diagram showing a modification of the amplifier illustrated in FIG. 11.

FIG. 14 shows a modification of the second embodiment (FIG. 11). This modification differs from the amplifier of FIG. 11 in three respects. First, Darlington-connected NPN transistors 71 and 72 are used in place of second-stage bipolar transistor 22. Secondly, the current path of control FET 73 is connected between the collector and base of transistor 72. Thirdly, capacitor 74 for grounding the high-frequency components of a signal, is coupled between the base of transistor 71 and gain control terminal 3. If control FET 73 has excellent DC characteristics, the modification of FIG. 14 can have as good an input-output characteristic as the first and second embodiments shown in FIGS. 5 and 11.

In the embodiments described above, a high-frequency input signal is supplied to terminal 1 (in other words, the gate of transistor 21), and a gain control voltage is applied to terminal 3, thereby amplifying the high-frequency input signal by the gain corresponding to the gain control voltage. The present invention is not limited to these embodiments. Other input signals, such as a low-frequency signal or an intermediate-frequency signal, can be amplified. Furthermore, first and second signals can be input to terminals 1 and 3, whereby they are mixed.

The circuits of the above embodiments can be manufactured either in the form of an integrated circuit made by a bipolar/MOS process, or in the form of an assembly of independently made elements. The circuits can be manufactured using compound semiconductor, for example GaAs.

Figure 15:
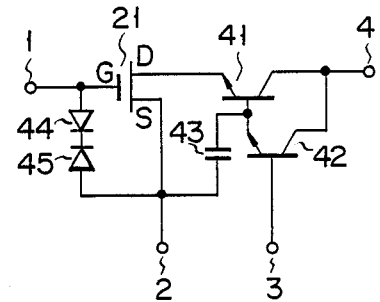
FIG. 15 is a circuit diagram showing a modification of the amplifier illustrated in FIG. 9.

The amplifier shown in FIG. 15, which is a modification of the amplifier shown in FIG. 9, can be formed on one pellet mode of silicon, by a bipolar/MOS process, in the form of an integrated circuit is described. The amplifier of FIG. 15 is different from that of FIG. 9 in two respects. First, capacitor 43 is connected at one end to the source of FET 21. Secondly, a bidirectional diode consisting of protective diodes 44 and 45 connected in series and arranged in opposite directions, is connected between the gate and source of FET 21, thus protecting the gate of FET 21.

Figure 16:
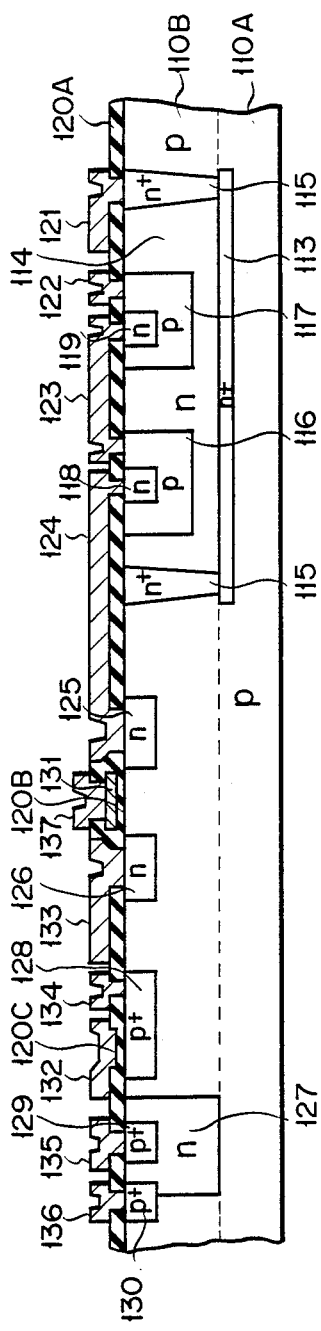
FIGS. 16 and 17 are sectional views of the amplifier of FIG. 15, formed on one pellet.
Figure 17:
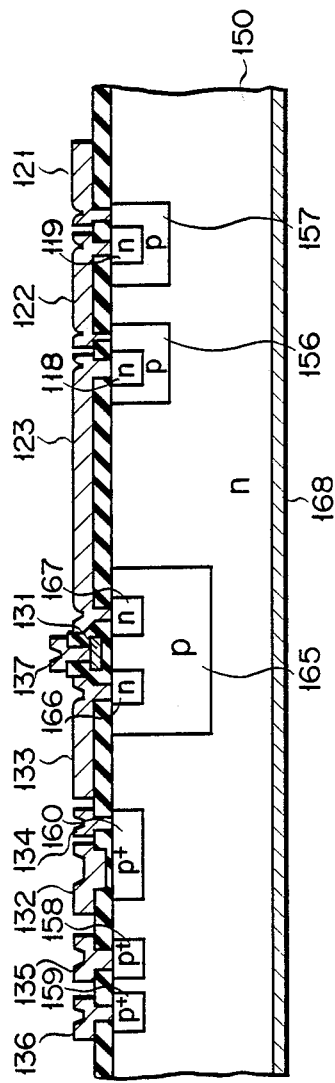

FIG. 16 is a cross-sectional view of the amplifier of FIG. 15, formed in or on a p-type silicon substrate. FIG. 17 is a cross-sectional view of the same amplifier formed on an n-type silicon substrate.

As illustrated in FIG. 16, p-type epitaxial layer 110B is formed on p-type silicon substrate 110A. Buried layer 113 having a high n-type impurity concentration ($n^+$-type), is formed at the interface between silicon substrate 110A and epitaxial layer 110B. Two regions, n-type well region 114 and $n^+$-type region 115, are formed in that portion of epitaxial layer 110B which is located on $n^+$type buried layer 113. Region 115 is shaped like a ring and surrounds well region 114, for example. In the surface region of well region 114, p-type regions 116 and 117 are formed, set apart from each other. One n-type region 118 is formed in the surface region of p-type region 116, and another n-type region 119 is formed in the surface region of p-type region 117. Oxide film 120A is formed on epitaxial layer 110B. Five contact holes are cut in those portions of oxide film 120A which are provided on $n^+$-type region 115, p-type regions 116 and 117, and n-type regions 118 and 119. Electrodes 121, 122, 123, and 124 made of aluminum are formed on oxide film 120A. Electrode 121 contacts $n^+$-type region 115. Electrode 122 contacts p-type region 117. Electrode 123 connects p-type region 16 and n-type region 119. Electrode 124 connects n-type region 118 to n-type region 125 corresponding to drain D of MOSFET 21.

In the amplifier of FIG. 16, n-type well region 114, p-type region 116, and n-type region 118 correspond to the collector, base, and emitter of first-stage transistor 41 (FIG. 15), respectively and n-type well region 114, p-type region 117, and n-type region 119 correspond to the collector, base, and emitter of second-stage transistor 42 (FIG. 15), respectively. Electrodes 121 and 122 correspond, respectively, to output terminal 4 and gain control terminal 3, both shown in FIG. 15.

In a surface region of epitaxial layer 110B, other than the surface region in which regions 115, 116, and 117 are formed, n-type regions 125, 126, and 127, and $p^+$-type region 128 are formed. In the surface region of n-type region 127, $p^+$-type region 129 is formed. Another $p^+$-type region 130 is formed partly in n-type region 127 and partly in the surface region of epitaxial layer 110B. Insulation film 120B (i.e., gate oxide film) is formed on that portion of epitaxial layer 110B which is located between n-type regions 125 and 126. Gate electrode 131 is formed on insulation film 120B. Thin oxide film 120C is formed on one portion of $p^+$-type region 128. Aluminum electrode 132 is formed on thin oxide film 120C. Six contact holes are cut in those portions of oxide film 120A formed on epitaxial layer 110B, which are located in n-type regions 125 and 126, $p^+$-type regions 128, 129, and 130, and gate electrode 131. Electrodes 133, 134, 135, 136, and 137 made of aluminum, are formed on oxide film 120A. Electrode 133 contacts n-type region 126. Electrodes 134, 135, and 136 contact $p^+$-type regions 128, 129, and 130, respectively. Electrode 137 contacts gate electrode 131.

N-type regions 125 and 126, and gate electrode 131 correspond to the drain, source, and gate of FET 21 (FIG. 15), respectively. Electrodes 137 and 133 correspond to input terminal 1 and terminal 2 (both shown in FIG. 15), respectively. Electrodes 132 and 134 correspond to the electrodes of capacitor 43 (FIG. 15). Electrodes 132 and 134 are connected by aluminum wires (not shown) to electrodes 123 and 133, respectively. Electrodes 135 and 136 correspond, respectively, to the anodes of diodes 44 and 45, and are connected to electrodes 137 and 133 by wired (not shown).

The circuit shown in FIG. 15 is made in the form of a pellet, and is attached to a lead frame (not shown) by gold-silicon eutectic or by a resin. The lead terminals corresponding to terminals 1, 3, and 4, and electrodes 137, 122, and 121 corresponding to input terminal 1, gain control terminal 3, and output terminal 4, are connected by a wire-bonding. Electrode 133, which is connected to the source of MOSFET 21 and corresponds to terminal 2, is connected to the lead frame by a wire-bonding.

A method of manufacturing the IC wafer having the structure of FIG. 16 will now be explained. First, an oxide film is formed on one major surface of p-type silicon substrate 110A doped with boron in a concentration of, for example, $4 \times 10^{14}$ cm$^{-3}$. The oxide film is patterned, exposing that portion of substrate 110A in which buried layer 113 will be formed. Antimony in a concentration of $5 \times 10^{19}$ cm$^{-3}$ is diffused into substrate 110A, using the patterned oxide film as the diffusion mask, thereby forming n+-type buried layer 113. Epitaxial layer 110B of silicon containing boron in a concentration $1.8 \times 10^{15}$ cm$^{-3}$ is formed on substrate 110A; this epitaxial layer has a thickness of 7 to 8 μm.

An oxide film is then formed on epitaxial layer 110B. This oxide film is patterned, exposing those portions of epitaxial layer 110B in which regions 114, 115, and 127 will be formed. Using the patterned oxide film as a mask, phosphorus is ion-implanted into epitaxial layer 110B, under acceleration voltage of 150 kev, in a dosage of $1 \times 10^{15}$ cm$^{-2}$, thereby forming regions 114 and 127, and under acceleration voltage of 50 kev, in a dosage of $9 \times 10^{15}$ cm$^{-2}$, thereby forming region 115. Further, PSG is deposited in the openings of the oxide film. The resultant structure is annealed for 15 hours at 1200° C. in a nitrogen gas atmosphere. As a result, n-type well region 114, n+-type region 115, and n-type region 127 are completed. Another oxide film is formed on the surface of the unfinished product, and has a thickness of 180 nm. This oxide film is patterned, to form regions 116, 117, 128, 129, and 130. Using the patterned oxide film as mask, boron is ion-implanted into epitaxial layer 110B under acceleration voltage of 50 kev, in a dosage of $1 \times 10^{14}$ cm$^{-2}$, and the resultant structure is annealed for 30 minutes at 1000° C. in a nitrogen atmosphere, thus forming p-type regions 116 and 117. Further, using the same patterned oxide film as a mask, boron is ion-implanted into epitaxial layer 110B under acceleration voltage of 50 kev, in a dosage of $1 \times 10^{14}$ cm$^{-2}$, and the unfinished product is annealed for 30 minutes at 1000° C. in a nitrogen gas atmosphere, thereby forming p+-type regions 128, 129, and 130.

Then, gate oxide film 120B and oxide film 120C for forming a capacitor (i.e., the film insulating the electrodes of the capacitor) are formed. Gate electrode 131 having a width of 1.5 μm is formed of molybdenum silicide (MoSi). Using gate electrode 131 as a mask, arsenic is ion-implanted into epitaxial layer 110B under acceleration voltage of 35 kev, in a dosage of $1 \times 10^{15}$ cm$^{-2}$, and the resultant structure is annealed for 30 minutes at 900° C. in a nitrogen gas atmosphere, thereby forming n-type regions 125 and 126. Using gate electrode 131, arsenic is ion-implanted into regions 116 and 117 under acceleration voltage of 35 kev, in a dosage of $1 \times 10^{15}$ cm$^{-2}$, and the resultant structure is annealed for 20 minutes at 1000° C. in a nitrogen gas atmosphere, thereby forming n-type regions 118 and 119. The oxide film is patterned, thus making contact holes. The unfinished product is subjected to thermal oxidation, whereby oxide film 120A is formed. An aluminum film is then formed on oxide film 120A. The aluminum film is patterned, thereby forming electrodes 121-124 and electrodes 132-137.

Gain-controlled amplifiers of the structure shown in FIG. 16 were made and tested for their characteristics. Capacitor 43 formed in each of these amplifiers had capacitance of about 50 PF. MOSFET 21 of each amplifier exhibited substantially the same high-frequency characteristics as the first-stage dual-gate MOSFET used in the conventional amplifier (FIG. 1). The frequency characteristic of first-stage transistor 41 was about fT=1 GHz for current amplification factor hFE, and transistor 41 maintained its current characteristic so long as the collector current was about 50 mA or less. Both Darlington-connected bipolar transistor 41 and 42 had current amplification factor hFE of about 100. In these gain-controlled amplifiers, the base current for controlling the gain was so small that no base input resistance was required. Since there existed no base input resistance which would change the base potential, to prevent the collector current from increasing, there was no risk that the equivalent resistance of either bipolar transistor would rise too much. It was ascertained that the third distortion components of the input-output characteristic curve of these amplifiers were less prominent than those of the characteristic curve (FIG. 7) of the amplifier shown in FIG. 5.

The gain-controlled amplifier shown in FIG. 17 differs from the gain-controlled amplifier of FIG. 16 in the following respects:

(1) N-type silicon substrate 150 is used.

(2) P-type regions 156 and 157 for the basis of bipolar transistors, are formed in the surface region of substrate 150. P+-type regions 158 and 159 for the anodes of the diodes 44, 45, and p+-type region 160 for one electrode of capacitor 43, are also formed in the surface region of substrate 150.

(3) P-type well region 165 is formed in substrate 150, and n-type regions 166 and 167 for the source and drain regions of MOSFET 21, are formed in p-type well region 164.

(4) Metal base 168 consisting of a vanadium (V) layer, a nickel (Ni) layer, a gold-germanium-antimony (AuGeSb) layer, and a gold (Au) layer, is formed on the lower surface of substrate 150.

Expect for different features (1)-(4), the amplifier of FIG. 17 is the same as that of FIG. 16. Therefore, the same elements as those used in the amplifier shown in FIG. 16 are designated by the same numerals in FIG. 17, and are therefore not described.

As is mentioned above, the signal-processing circuit of this invention can be used as a gain controlled amplifiers, since its input-output characteristic curve has far less third distortion components as compared to the characteristic curves of the conventional gain-controlled amplifiers. Hence, it can operate effectively, particularly when it is used as a high-frequency amplifier whose gain is controlled by AGC (automatic gain control) feedback voltage. Further, when the signal-processing circuit is employed as a mixing circuit, it can generate an output signal having negligibly small distortion components; in particularly, negligible third distortion components.

What is claimed is:

1. A signal-processing circuit comprising:
means for receiving a first signal;
a first MOSFET (metal oxide semiconductor field-effect transistor) whose gate is connected to the means for receiving the first signal and whose current path is supplied at one end with a predetermined potential;
means for receiving a second signal;
means for supplying an output signal;
a first NPN bipolar transistor whose collector-emitter path is coupled at one end to the other end of the current path of the first MOSFET, and at the other end to the means for supplying the output signal; and
a second NPN bipolar transistor whose collector-emitter path is coupled at one end to the base of the first NPN bipolar transistor and at the other end to the means for supplying the output signal, whose base is coupled to the means for receiving the second signal, and which controls the base current of the first NPN bipolar transistor in accordance with the second signal.

2. The circuit according to claim 1, which is a gain-controlled amplifier for amplifying the first signal supplied to the gate of said MOSFET, with the gain corresponding to the second signal supplied to the base of said second NPN base bipolar transistor.

3. The circuit according to claim 1, which is a mixing circuit for mixing the first signal supplied to the gate of said MOSFET and the second signal supplied to the gate of said second NPN bipolar transistor.

4. The circuit according to claim 1, wherein said MOSFET is an N-channel enhancement MOSFET.

5. The circuit according to claim 1, wherein the circuit further comprises a second MOSFET whose current path is connected at one end to the means for supplying the output signal, and at the other end to the base of the second NPN transistor, whose gate is coupled to said means for receiving the second signal, and which controls the base current of the second NPN transistor in accordance with the second signal supplied to the gate.

6. The circuit according to claim 5, further comprising a capacitor having a pair of electrodes and connected, at one of the electrodes, to the base of the first NPN transistor, and at the other electrode to the gate of the second MOSFET.

7. The circuit accordig to claim 5, wherein said second signal is a voltage signal.

8. The circuit according to claim 1 wherein said NPN bipolar transistors and said MOSFET are formed on the same semiconductor pellet, by a bipolar/MOS process.

9. The circuit according to claim 1, wherein said first and second NPN transistors and said first MOSFET are formed on the same semiconductor pellet, by a bipolar/MOS process, the common collector of said NPN transistors is a first n-type region formed in a p-type semiconductor substrate, the bases of said NPN transistors are two p-type regions formed in the first n-type region, the emitters of said NPN transistors are two second n-type regions formed in the two p-type regions, the base of said first NPN transistor is connected by a wire to the emitter of the second NPN transistor, said first MOSFET is also formed in the p-type semiconductor substrate, and the drain of said first MOSFET is connected by a wire to the emitter of said first NPN transistor.

10. The circuit according to claim 1, wherein said first and second NPN transistors and said first MOSFET are formed on the same semiconductor pellet, the common collector of said two NPN transistors is an n-type semiconductor substrate, the bases of said two NPN transistors are two p-type regions formed in the n-type semiconductor substrate, the emitters of two NPN transistors are two n-type regions formed in the two p-type regions, respectively, the base of said first NPN transistor is connected by a wire to the emitter of the second NPN transistor, said first MOSFET is also formed in the n-type semiconductor substrate, and the drain of said first MOSFET is connected by a wire to the emitter of said first NPN transistor.

11. The circuit according to claim 1, wherein said first and second NPN bipolar transistors and said first MOSFET are formed on the same semiconductor pellet, by a bipolar/MOS process.

12. The circuit according to claim 1, further comprising a capacitor having a pair of electrodes and connected, at one of the electrodes, to the base of the first NPN transistor, and at the other electrode to the base of the second NPN transistor.

13. The circuit according to claim 1, wherein said second signal is a voltage signal.

14. A gain controlled amplifier circuit comprising:
a first MOSFET (metal oxide semiconductor fielf-effect transistor) whose current path is supplied at one end with a predetermined potential;
a first NPN bipolar transistor whose emitter is connected to the other end of said first MOSFET; and
further comprising a second MOSFET whose current path is connected at one end to the collector of said first NPN bipolar transistor, and at the other end of the base of said first NPN bipolar transistor, and wherein a signal supplied to the gate of said first MOSFET is amplified with a gain corresponding to a voltage applied to the gate of said second MOSFET, thereby generating an output signal in the collector of said first NPN bipolar transistor.

15. A gain controlled amplifier circuit, comprising:
a first MOSFET whose current path is supplied at one end with a predetermined potential;
a first NPN bipolar transistor whose emitter is connected to the other end of said first MOSFET;
a second MOSFET whose current path is connected one end to the collector of said first NPN bipolar transistor; and
a second NPN bipolar transistor whose emitter is coupled to the base of the first NPN bipolar transistor, whose base is coupled to the other end of said second MOSFET, and whose collector is coupled to the collector of the first NPN bipolar transistor, wherein a signal supplied to the gate of said first MOSFET is amplified with a gain corresponding to a voltage applied to the gate of said second MOSFET, thereby generating an output signal in the collector of said first NPN bipolar transistor.

16. A signal-processing circuit comprising:
means for receiving a first signal;
a first MOSFET (metal oxide semiconductor field-effect transistor) whose gate is connected to the means for receiving the first signal and whose current path is supplied at one end with a predetermined potential;
means for receiving a second signal;
means for supplying an output signal;
an NPN bipolar transistor whose collector-emitter path is coupled at one end to the other end of the current path of the MOSFET, and at the other end to the means for supplying the output signal; and
a second MOSFET whose current path is connected at one end to the means for supplying an output signal, and at the other end to the base of said NPN bipolar transistor, whose gate is coupled to said means for receiving the second signal, and which controls the base current of said NPN bipolar transistor in accordance with the second signal.

17. The circuit according to claim 16, which is a gain-controlled amplifier for amplifying the first signal supplied to the gate of said first MOSFET, with the gain corresponding to the second signal supplied to the gate of said second MOSFET.

18. The circuit according to claim 16, which is a mixing circuit for mixing the first signal supplied to the gate of said first MOSFET and the second signal supplied to the gate of said second MOSFET.

19. The circuit according to claim 16, wherein said first MOSFET is an N-channel enhancement MOSFET.

20. The circuit according to claim 16, further comprising a capacitor having a pair of electrodes and connected, at one of the electrodes, to the base of the NPN transistor, and at the other electrode to the gate of the second MOSFET.

21. The circuit according to claim 16, wherein said second signal is a voltage signal.

* * * * *